United States Patent [19]

Hyer

[11] 4,112,359
[45] Sep. 5, 1978

[54] FREQUENCY TRANSDUCER CIRCUIT WITH OUTPUT CALIBRATION

[75] Inventor: Donald R. Hyer, Lynnfield, Mass.

[73] Assignee: General Electric Company, New York, N.Y.

[21] Appl. No.: 787,907

[22] Filed: Apr. 15, 1977

[51] Int. Cl.² ............................................. G01R 23/02
[52] U.S. Cl. .................................. 324/78 E; 324/78 J
[58] Field of Search .................. 324/78 R, 78 J, 78 E, 324/169; 307/233, 202, 273, 261, 253, 310; 328/140

[56] References Cited

U.S. PATENT DOCUMENTS

| | | | |
|---|---|---|---|
| 3,252,089 | 5/1966 | Nye, Jr. | 324/78 J |
| 3,497,719 | 2/1970 | Scourtes | 324/78 J |

OTHER PUBLICATIONS

Don Lancaster, "Direct Readout IC Freq Meter", Popular Electronics, Oct. 1967, pp. 53-56, 98.

*Primary Examiner*—M. Tokar
*Attorney, Agent, or Firm*—W. C. Bernkopf; R. G. Simkins

[57] ABSTRACT

A frequency transducer circuit for providing a precisely adjusted range of output currents characterized by the combination of a diode pump circuit with a low impedance input circuit including a control transistor with a first variable impedance for determining the upper limit of the output range, and a biasing circuit with a second variable impedance for adjusting the lower limit of the output range.

Calibration of the output current range is facilitated in one preferred embodiment of the invention by eliminating interaction between the upper and lower range limit adjustments.

10 Claims, 4 Drawing Figures

FREQUENCY TRANSDUCER CIRCUIT WITH OUTPUT CALIBRATION

BACKGROUND OF THE INVENTION

The invention relates to frequency transducers having means for precisely calibrating the upper and lower output current range limits thereof and, more particularly, relates to a frequency meter having means for easily calibrating the full scale and zero indications of the meter.

Heretofore it has been generally well-known to utilize diode pump circuits to provide a frequency transducing function. One common application for such frequency transducing circuits is in the manufacture of electronic tachometers. For example, U.S. Pat. No. 3,314,007, which issued on Apr. 11, 1967, illustrates such a diode pump circuit with a zener diode regulated input and a meter connected to provide a visual indication of variations in the frequency of monitored signals. It will be recognized that in using such a frequency transducer it is desirable to provide means for precisely calibrating the output indicating meter at both the maximum and minimum ends of its indicating range. A major obstacle to achieving such calibration is the inherent interaction in a simple diode pump circuit between its input and its output signals. Due to this interaction, a calibrating adjustment made for either end of the indicating range of the meter will normally cause a variance in the calibration of the meter at the other end of its indicating range. The present invention provides a solution to this common problem.

Before proceeding with a further description of the objects and advantages of the present invention, it is believed desirable to note the teachings of another U.S. patent, namely, U.S. Pat. No. 2,762,974 which issued on Sept. 11, 1956. Reference is made to this earlier patent merely to provide the reader with a clear understanding of the type of circuits referred to herein by the descriptive phrase "diode pump circuit." Thus, explained in that patent, such a simplified diode pump circuit is shown in FIG. 1 thereof. Of course, those skilled in the art will certainly appreciate that when such a diode pump circuit is used in a frequency transducer application the output terminals of the pump circuit may be connected to a variety of loads, such as to a meter, as illustrated in the aforementioned U.S. Pat. No. 3,314,007, or to an amplifier for supplying input signals to alternate indicating or load means. In all such cases, however, it is desirable to provide some means for effectively calibrating both ends of the range of output currents of the diode pump circuit.

Accordingly, an object of the present invention is to provide a frequency transducer circuit including a diode pump circuit in combination with a low impedance input transistor and two variable impedance means for separately adjusting the maximum and minimum limits of the output current range of the circuit in a manner such that interaction between the calibrating adjustments is minimized.

Another object of the invention is to provide a frequency transducer circuit having a diode pump circuit in combination with a low impedance input circuit and a variable impedance biasing circuit that are, respectively, adjustable to calibrate the full scale and zero settings of a meter connected to the output terminals of the transducer.

Yet another object of the invention is to provide an economical to manufacture, and reliable in operation, frequency transducer circuit incorporating variable impedance means for adjusting the full scale and zero settings of an indicating meter while eliminating interaction between the calibrating impedances.

Additional objects and advantages of the invention will be apparent to those skilled in the art from the description of it presented herein, considered with the accompanying drawing.

SUMMARY OF THE INVENTION

In one preferred form of the invention a frequency transducer circuit having a diode pump circuit in combination with a low input impedance circuit is characterized by incorporating a variable impedance in the input circuit to adjust the output current at an upper limit of a predetermined range, and a biasing circuit for adjusting the output current at a lower limit of said range so that the output of the transducer can be precisely calibrated to adjust for manufacturing tolerances of components in the circuit. In another preferred embodiment of the invention interaction between the full scale and zero scale adjustments afforded by the aforementioned input and biasing circuits is eliminated to facilitate the accomplishment of such calibrations.

DESCRIPTION OF THE PREFERRED EMBODIMENT

Figure 1:
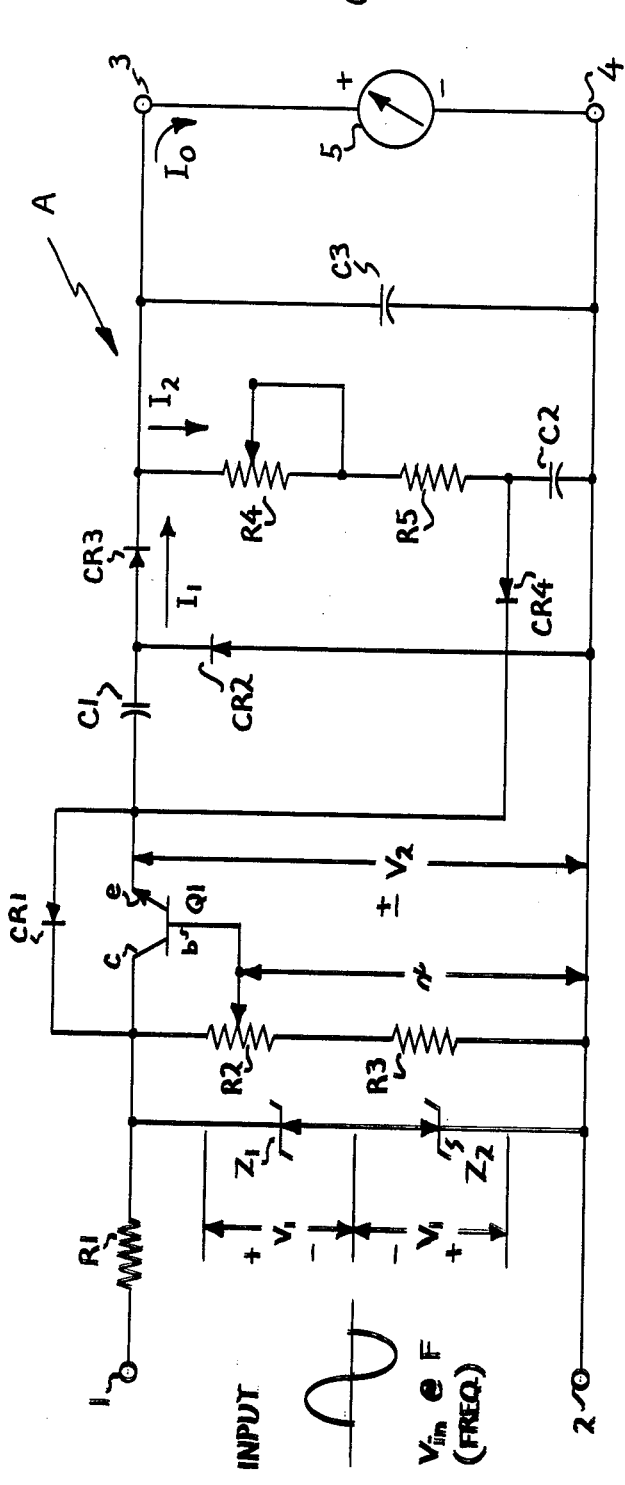
FIG. 1 is a schematic circuit diagram of a frequency transducer circuit constructed pursuant to the invention, shown connected to an output current indicating meter.
Figure 3:
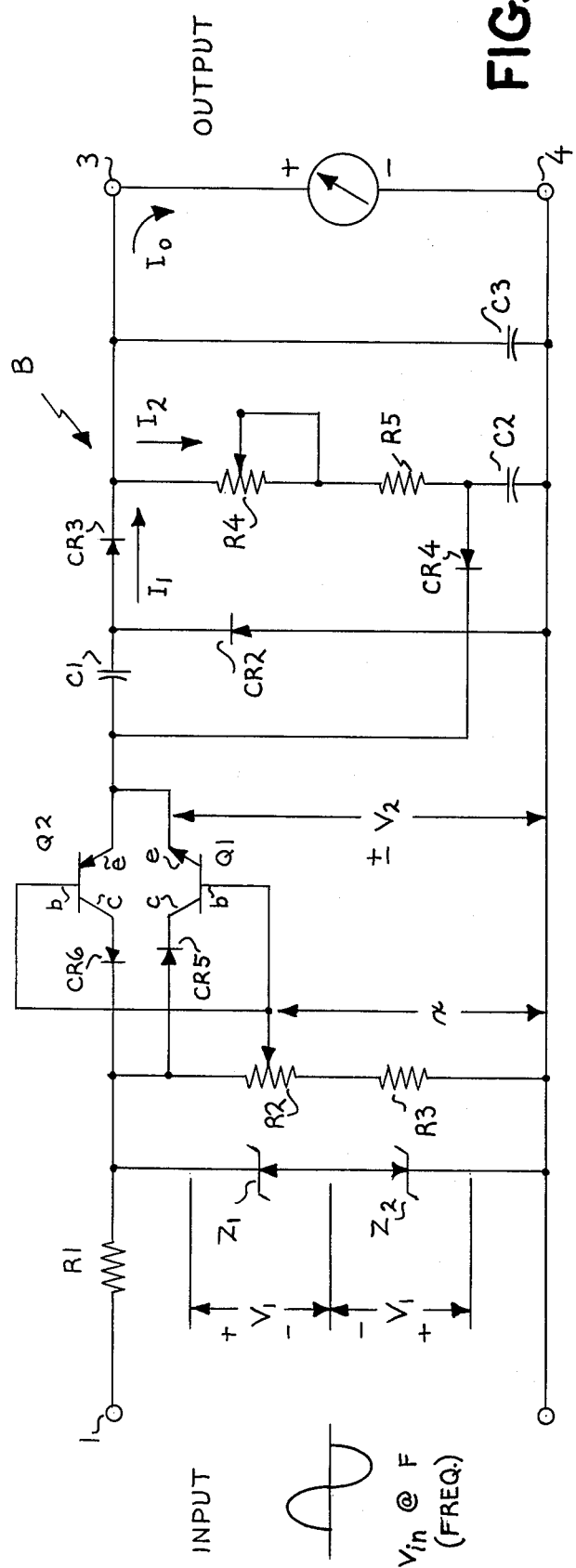
FIG. 3 is a circuit diagram showing a second embodiment of the frequency transducer circuit of the invention provided with variable impedance means for adjusting the maximum and minimum limits of the range of output currents of a capacitor diode pump so that interaction between the adjustment means is eliminated to ease calibration of the meter.

The frequency transducer circuits of the preferred embodiments of the invention illustrated in FIGS. 1 and 3 herein are shown connected to visual indicating instruments that enable these circuits to be used as frequency measuring circuits. As the description of the invention proceeds, it will be clear to those skilled in the art that the basic frequency transducer circuits disclosed can be used in alternative applications to provide different types of functional outputs.

In order to explain the basic output current calibrations that are afforded by my invention to adjust maximum and minimum output current limits to account for manufacturing tolerances of components in the circuit, reference is first made to FIG. 1. The frequency transducer circuit A, shown in FIG. 1, comprises a relatively conventional diode pump circuit including a pair of input terminals 1 and 2, an input resistor R1, a pair of zener diodes Z1 and Z2 arranged to provide a clipped input voltage to the primary diode pump capacitor C1 and a pair of diodes CR2 and CR3 connected as shown to the respective output terminals 3 and 4. Although a source of voltage is not shown in FIG. 1, it will be appreciated that in a normal application of the diode pump circuit to measure frequency, the input terminals 1 and 2 would be connected to a suitable source of such an alternating voltage so that an input voltage having a cyclical waveform, such as the sinusoidal form illustrated in FIG. 1, would be applied across the input terminals 1 and 2. A conventional ammeter 5 is connected to the output terminals 3 and 4 of the frequency transducer circuit A in order to provide a visual indication of variations in the frequency of a monitored input voltage. It should be recognized that other output means such as an amplifying circuit, may be connected across the output terminals 3 and 4 in lieu of the meter 5. The other components of the circuit shown in FIG. 1 are provided to afford the calibration adjustments provided by the present invention so that a specific range of output currents can be obtained to compensate for manufacturing variances in the components used.

In order to reduce the effects of distorted input waveforms which are frequently encountered in measuring frequencies on power distribution systems, it is essential to the accurate operation of the frequency transducer circuit A that the charge and discharge time constants of the diode pump circuit be kept small. This desired objective is afforded in the embodiment of the invention shown in FIG. 1 by providing a low impedance input circuit including a first control transistor Q1 connected with its collector and emitter in series with primary capacitance C1 of the diode pump circuit, in combination with a diode CR1 connected in parallel with transistor Q1 to pass to the primary capacitor current opposite in polarity to that passed through the transistor. These components of the low impedance input circuit are connected as shown in FIG. 1 to the input resistor R1 and zener diodes Z1 and Z2. In applications of the circuit where it is desirable to further reduce the effects of odd harmonics on an input waveform, the input resistor R1 may be replaced by a suitable inductance.

Figure 2:
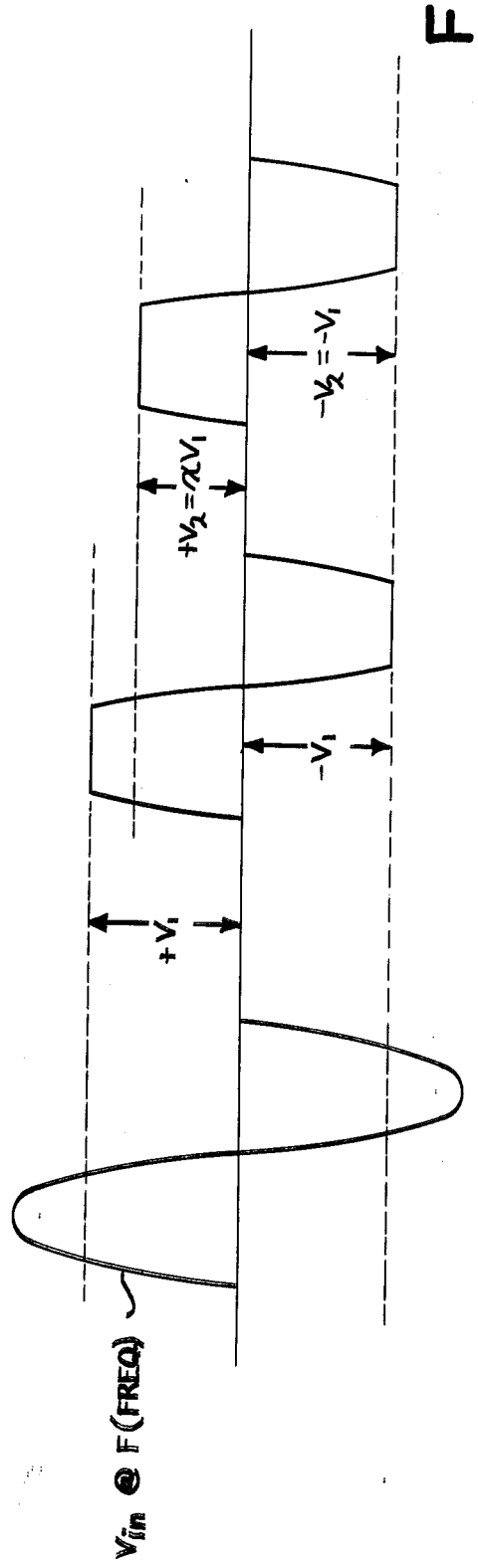
FIG. 2 is a graph showing a series of voltage waveforms monitorable at the respective points referenced by associated alpha-numerics in the circuit of FIG. 1.

The output current of the transducer circuit A at the upper limit of a predetermined range is adjusted by varying the base voltage of transistor Q1. In the embodiment of the invention illustrated in FIG. 1, the means for adjusting the base voltage of transistor Q1 comprises a first variable impedance in the form of a potentiometer R2 connected in series with a fixed resistor R3 to receive the clipped input voltages $+V_1$ and $-V_1$, as shown in FIGS. 1 and 2 of the drawing. It will be seen that as the variable impedance R2 is adjusted to connect voltage $xV_1$ to the base of transistor Q1, the transistor acts to control the output voltage at the emitter to essentially this value ($+V_2$), neglecting the small base to emitter voltage. Thus, adjusting of the potentiometer R2 provides a desirable means for precisely calibrating the full scale reading of the meter 5 connected to output terminals 3 and 4.

Similarly, precise calibration of the zero scale reading of meter 5, or of the minimum current limit selected for the output current range of the transducer circuit A, is afforded by a biasing circuit. In the embodiment shown, the biasing circuit includes a second variable impedance R4 comprising a potentiometer and a fixed resistor R5 connected in series with a capacitor C2, thereby to parallel the capacitor C2 and the second variable impedance R4 with the output terminals 3 and 4 of the diode pump circuit. In addition, a diode CR4 is connected between the junction of the series connected capacitor C2 and variable impedance R4 and the junction of the emitter of control transistor Q1 with the primary capacitance C1. Since the output current, designated $I_0$ in FIG. 1, is equal to the current $I_1$ through diode CR3 minus the biasing current $I_2$ through the second variable impedance R4, it will be appreciated that the impedance R4 can be adjusted to provide a precise calibration of the zero scale reading on meter 5, or alternatively, to precisely determine the minimum limit of a selected range of output currents ($I_0$) for the transducer circuit A, if it is used to supply an amplifier or other coupled circuits. Incidentally, a smoothing capacitor C3 is preferably connected between the output terminals 3 and 4, as shown in FIG. 1.

The operation of the first variable impedance R2 and the second variable impedance R4 to precisely calibrate the full scale and zero scale readings of the meter 5, respectively, may be more fully understood by referring to the voltage waveforms depicted in FIG. 2. Assuming that the charge and discharge time constants of the circuit are small, the charge and discharge current of a suitably stable capacitor, such as the primary capacitor C1 in transistor circuit A, can be stated as follows:

$$I_1 = CF(V_1 + V_1)$$

The voltages $+V_1$ and $-V_1$ determined by zener diodes Z1 and Z2 are illustrated in their clipped form at the mid-portion of FIG. 2, relative to the sinusoidal input voltage $V_{IN}$ referenced in FIG. 1 and shown on the left in FIG. 2. Adjustment of the variable impedance R2 determines the output voltage V2 at the emitter of transistor Q1 as illustrated in FIG. 1. Thus, the current $I_1$ through the output diode CR3 of the diode pump circuit can be expressed as:

$$I_1 = C_1F(V_1 + XV_1)$$

As can be seen by the unbalanced voltage of opposite polarities appearing at the emitter of transistor Q1, although the illustrated circuit provides a means for suitably adjusting the full scale calibration of meter 5, such an adjustment interacts with the zero scale adjustment provided by the biasing circuit R4, CR4, etc. The other preferred embodiment of the invention described below provides a means for eliminating such interaction between the two output current limit adjusting means of the frequency transducer circuit A of the invention. Before leaving the description of the circuit illustrated in FIG. 1, however, it may be helpful to note that the output current $I_0$ can be essentially determined from the following equation, neglecting base to emitter voltages and assuming charge and discharge time constants are relatively small, thus:

$$I_0 = I_1 - I_2 = CF(V_1 + XV_1) - K(V_1)$$

It should be apparent from the foregoing equation and from the voltage waveform shown in FIG. 2, if it is not already apparent from the illustration of the transducer circuit A shown in FIG. 1, that the output current $I_0$ would be present in half wave rectified form if the diode CR1 were eliminated from the circuit or if the zener diode Z2 is removed. Rather than use such a half wave rectified output current $I_0$, it is believed preferable in most frequency transducer circuits to utilize both the positive and negative polarity currents by including the diode CR1 and zener diode Z2 as described above.

Turning now to the frequency transducer circuit B, illustrated in FIG. 3 of the drawing, it will be readily seen that most of the components therein are similar in type and circuit arrangement to those illustrated in the circuit of FIG. 1. Accordingly, identical numerals and letters have been used in the circuit of FIG. 3 to identify component parts similar in type and function to those illustrated in the circuit of FIG. 1. In view of this fact and the relative simplicity of the circuit, which it will be understood operates in generally the same manner as the circuit illustrated in FIG. 1, except for the particular differences that will be pointed out hereafter, only the further distinguishing features of the calibrating arrangement in circuit B will be described in detail below.

As is clearly shown in FIG. 3, the frequency transducer circuit B includes a second transistor Q2, opposite in polarity to transistor Q1. The emitter and collector of transistor Q2 are connected in parallel with the first transistor Q1, and the base connection is made to a first variable impedance R2 in common with the base connection to the first transistor Q1. In addition to replacing the diode CR1 of the circuit illustrated in FIG. 1 with the transistor Q2 as shown in FIG. 3, the frequency transducer circuit B is characterized by including a pair of diodes CR5 and CR6 connected in parallel, back-to-back relationship and in series, respectively, with the first and second transistors Q1 and Q2. This unique arrangement of the low impedance input circuit for the transducer circuit B affords a desired objective of the invention whereby interaction between the full scale and zero scale calibration adjustments is eliminated. As mentioned above, by thus eliminating the interaction between these two output current limit adjustments, the calibration of a meter such as meter 5 is greatly simplified.

Figure 4:
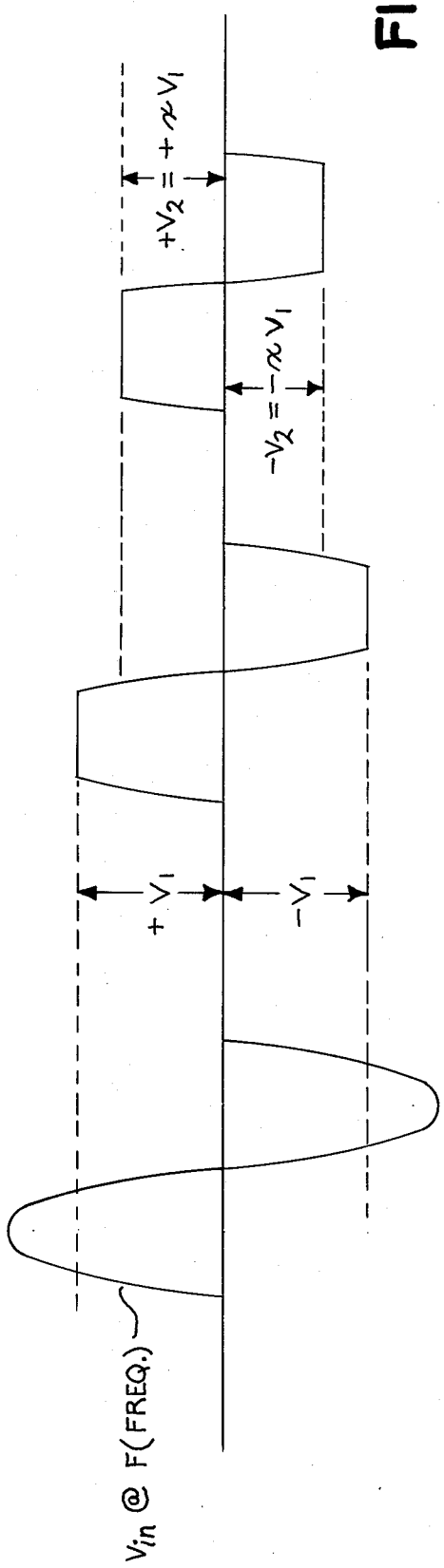
FIG. 4 is a graph showing a series of waveforms monitorable at respective points in the circuit of FIG. 2 identified by associated alpha-numerics therein.

Reference to FIG. 4 of the drawing and the following equation will help explain the reason for this advantageous result. And, it will be apparent from the equation that this advantage of the invention is optimized since the first and second transistor Q1 and Q2 control both the positive and negative output voltages ($V_2$ and $-V_2$) to be substantially equal to one another. Referring to the right side of FIG. 4, it will be seen that the voltages $+V_2$ and $-V_2$ at the emitters of transistors Q1 and Q2 equal plus and minus $XV_1$. Thus, when an equation similar to the equation stated above for the output current $I_0$ of the transducer circuit A is stated for the output current $I_0$ of the transducer circuit B, the equation is as follows:

$$I_0 = I_1 - I_2 = 2\,CFXV_1 - KXV_1$$

$$I_0 = XV_1\,(2CF-K)$$

Thus, it is clear that the zero current $I_2$ changes the same as current $I_1$ when the full scale adjusting potentiometer R2 is varied. This desirable relationship allows the full scale calibration of meter 5 to be adjusted without requiring the zero adjusting potentiometer R4 to be readjusted each time to compensate for variations in currents $I_1$ and $I_2$, such as those that occur with the embodiment of the invention described above with reference to FIG. 1.

It will be apparent to those skilled in the art that since the transistors Q1 and Q2 are opposite in polarity, it is not necessary to the proper functioning of the transducer circuit B to include diodes CR5 and CR6; however, these diodes are provided in the preferred embodiment of the invention to protect the respective transistor base to collector junctions during reverse half cycles of the input voltage.

It will also be obvious that various modifications and improvements can be made in the preferred embodiment of the invention described without departing from its teachings or the spirit. Accordingly, the true scope of the invention is intended to be limited only by the claims at the conclusion of this application. Furthermore, although various suitable values may be used for the respective components of the circuits shown in FIGS. 1 and 3 in practicing the invention, the values listed below in Table I may be used in given frequency meter applications of the invention. These exemplary values are not intended to limit the scope of the invention in any way.

TABLE I

| Component | Type |
|---|---|
| Zener Diodes Z1 and Z2 | 1N968B, 20V |
| Resistor R1 | 6,000 Ohms (for 120 volt a.c. circuit) |
| Resistor R3 | 3.1 K Ohms |
| Resistor R5 | 10.0 K Ohms |
| Potentiometers R2 and R4 | 2K Ohms |
| Transistor Q1 | 2N2714 |
| Transistor Q2 | 2N5355 |
| Capacitor C1 | 0.68 microfarad (for 60 Hz measurement) |
| Diodes CR1, CR2, CR3 and CR4 | 1N645 |
| Capacitor C2 | 10 microfarad |
| Capacitor C3 | 100 microfarad |
| Milliammeter | 0–200 milliamp (for 55–65 Hz range, 690 ohms internal resistance) |

What I claim as new and desire to secure by Letters Patent of the United States is:

1. A frequency transducer circuit for providing a precisely adjusted range of output currents, comprising a diode pump circuit in combination with a low impedance input circuit including a first transistor having its collector and emitter connected in series with the primary capacitor of the diode pump circuit, a first variable impedance means operably connected for adjusting the current output of said first transistor thereby to adjust output current of the transducer circuit at the upper limit of said range, and a second variable impedance means connected to provide biasing current to the output of said transistor for adjusting output current of the transducer circuit at the lower limit of said range.

2. A frequency transducer circuit as defined in claim 1 including a diode connected between the emitter and collector of said first transistor to pass to said primary capacitor current opposite in polarity to the current through said transistor.

3. A frequency transducer circuit as defined in claim 1 including a second transistor having its emitter and collector connected in parallel with said first transistor and having its base connected to said first variable impedance in common with the base connection to said first transistor, and a pair of diodes connected in parallel, back-to-back relationship and in series, respectively, with said first and second transistors.

4. A frequency transducer circuit as defined in claim 1 including a second transistor opposite in polarity to the first transistor connected with its emitter and collector in parallel with said first transistor and having its base connected to said first variable impedance in common with the base connection to said first transistor.

5. A frequency transducer circuit as defined in claim 2 wherein said biasing circuit includes a diode connected in series with said second variable impedance between it and the emitter of said first transistor.

6. A frequency transducer circuit as defined in claim 3 wherein said biasing circuit includes a capacitor connected in series with said second variable impedance thereby to parallel said capacitor and second variable impedance with the output of said diode pump circuit, and a diode connected between the junction of said series connected capacitor and variable impedance and the emitters of said parallel transistors.

7. A frequency transducer circuit as defined in claim 6 wherein said low impedance input circuit includes at least two zener diodes connected in series across the input of said diode pump circuit to provide a series of clipped voltage pulses of alternating polarities to the commonly connected collectors of said first and second transducers.

8. A frequency transducer circuit as defined in claim 7 including an ammeter operably connected to the output terminals of said diode pump circuit.

9. A frequency transducer circuit as defined in claim 7 wherein said first and second variable impedances are potentiometers, and the movable contact of the first potentiometer is connected in common to the bases of said first and second transistors.

10. A frequency transducer circuit as defined in claim 7 wherein said first and second transistors are effective to control the output voltages at their respective emitters to be essentially equal in value.

* * * * *